United States Patent
Chen (10) Patent No.: US 6,601,592 B1
(45) Date of Patent: Aug. 5, 2003

(54) METHOD OF SEMICONDUCTOR SUBSTRATE BATCH DEMOUNTING

(76) Inventor: Zhengming Chen, 1019 Wunderlich Dr., San Jose, CA (US) 95129

( * ) Notice: Subject to any disclaimer, the term of this patent is extended or adjusted under 35 U.S.C. 154(b) by 114 days.

(21) Appl. No.: 09/685,734

(22) Filed: Oct. 11, 2000

(30) Foreign Application Priority Data

Sep. 1, 2000 (CN) ............................................ 00112498

(51) Int. Cl.[7] .............................. B08B 3/04; B08B 3/12
(52) U.S. Cl. .............................. 134/1.3; 134/2; 134/19; 134/25.4; 134/25.5; 134/32; 134/902
(58) Field of Search ............................... 134/1.3, 2, 19, 134/25.4, 25.5, 32, 902

(56) References Cited

U.S. PATENT DOCUMENTS

| | | | |
|---|---|---|---|
| 3,306,602 A | 2/1967 | Scholer et al. | 269/903 |
| 3,834,349 A | 9/1974 | Dietze et al. | 118/500 |
| 4,104,099 A | 8/1978 | Scherrer | 156/344 |
| 4,171,740 A | 10/1979 | Clement et al. | 206/213 |
| 4,473,455 A | 9/1984 | Dean et al. | 118/503 |
| 4,971,676 A | 11/1990 | Doue et al. | 118/503 |
| 5,273,615 A | 12/1993 | Asetta et al. | 156/381 |
| 5,472,086 A | 12/1995 | Holliday et al. | 206/711 |
| 6,076,585 A | 6/2000 | Klingbeil, Jr. et al. | 156/584 |

OTHER PUBLICATIONS

Adams et al, "Breaking the 1000 Wafers/Week Barrier Through Substrate Via Process," 2000 GaAs Mantech, pp. 75–78.

*Primary Examiner*—Zeinab El-Arini
(74) *Attorney, Agent, or Firm*—Intellectual Property Law Group LLP; Otto O. Lee; Juneko C. Jackson (57) ABSTRACT

This is a method of cassette-to-cassette batch demounting process that includes providing an apparatus having two cassettes for holding and separating semiconductor substrates. A first cassette is placed on top of a second cassette, using the first cassette as the top cassette that holds the semiconductor substrate and the support substrate, and the second cassette at the bottom as a bottom cassette that receives the semiconductor substrate after demounting process. The semiconductor substrate is loaded with its support substrate into a slot in the top cassette. The top cassette will let only the semiconductor substrate to descend to the bottom cassette while blocking the support substrate from exiting the top cassette. The two cassettes are then soaked in a hot solvent that can dissolve or melt an adhesive that adheres the semiconductor substrate to the support substrate in order to weaken the cohesive force between the two substrates. The thinned semiconductor substrate will gradually demount from its support substrate by gravitational force and vertically slides down into the bottom cassette.

12 Claims, 8 Drawing Sheets

METHOD OF SEMICONDUCTOR SUBSTRATE BATCH DEMOUNTING

BACKGROUND

This invention relates generally to semiconductor devices, and more specifically, to apparatuses and methods for manufacturing semiconductor devices.

The demounting or debonding process for separating thinned semiconductor substrates from their support substrates is one of the main identified causes for semiconductor substrate breakage during the manufacturing of semiconductor devices. Semiconductor substrate breakage is very costly because the demounting step is performed near the end of the manufacturing process, after most of the manufacturing costs have already been incurred.

Currently, the majority of the semiconductor device manufacturing industry uses a single semiconductor substrate separation process for semiconductor substrate demounting. Using this method, a single semiconductor substrate is separated from its support substrate one at a time. This process typically involves: (1) placing the support substrate and the semiconductor substrate, or ceramic substrate, onto a heated surface to melt an adhesive or grip material such as a wax or a mixture of wax with photoresistor that connects the support substrate to the semiconductor substrate, and (2) manually demounting the semiconductor substrate from the support substrate after the adhesive is melted in order to separate the semiconductor substrate from the support substrate.

One of the problems with the existing method of the semiconductor substrate separation process is that high incidents of semiconductor substrate breakage occur due to human error during the manual performance of the demounting step. This occurs because the semiconductor substrates become fragile when they are physically thinned by a grinder or a lapper machine, or they are chemically thinned by a chemical such as acid, during the processing of the semiconductor substrates. Via holes are drilled on the support substrates, which are typically made of sapphire, to make the dissolving agent permeate the support substrate and dissolve the adhesive. This is also a very costly process. Further, the demounted semiconductor substrates float in the dissolving solution and are subject to a significant amount of turbulence created by ultrasonic vibrations utilized in the process. Due to this process, the semiconductor substrates become extremely fragile during the demounting process, making manual performance of the demounting step extremely prone to human error and resulting in semiconductor substrate breakage.

Another problem with the existing process used to separate the thinned compound semiconductor substrate, or a ceramic substrate, from its support substrate is lack of efficiency. The existing demounting process is not efficient because the semiconductor substrates need to be manually and carefully demounted from their support substrates one at a time.

Due to the problems with the existing method of demounting, there is a need for a non-manual method of demounting or separating semiconductor substrates from their support substrates simultaneously and efficiently without breaking or otherwise fracturing the semiconductor substrates.

SUMMARY

This invention is directed to a method and apparatus for a non-manual method of demounting semiconductor substrates from their support substrates simultaneously and efficiently without damaging the semiconductor substrates.

A preferred version of the process of separating one or more semiconductor substrates from one or more support substrates having features of the present invention comprises the following steps. The first step comprises providing an apparatus having: (a) a top cassette having a plurality of vertical slots, and one or more small bars for stopping the support substrate from exiting the top cassette; and (b) a bottom cassette having a plurality of vertical slots. The next step comprises vertically inserting the semiconductor substrate into the slot of the top cassette while the semiconductor substrate is coupled to the support substrate, wherein the surfaces of each semiconductor substrate is positioned approximately parallel to a force of gravity during the inserting step. Then, the supporting step comprises supporting the support substrate above the small bars in the top cassette. Next, the introducing step comprises introducing the apparatus to a dissolving agent to separate the semiconductor substrate from the support substrate, wherein the first surface of each semiconductor substrate is positioned approximately parallel to the force of gravity during the introducing step, and wherein the force of gravity moves the semiconductor substrate from the top cassette towards the bottom cassette. The next step comprises removing the top cassette from the apparatus. This is followed by the exposing step that comprises exposing the apparatus to a cleaning agent to clean the semiconductor substrate. Next step comprises drying the semiconductor substrate after the cleaning step.

In another embodiment of the present invention, the providing step further comprises a basket in which the bottom cassette and the top cassette are placed.

In yet another embodiment of the present invention, the providing step further comprises providing the bottom cassette having a first wall, a second wall substantially parallel to the first wall and coupled to the first wall, a large bar embedded inside the first wall; and a large bar embedded inside the second wall, such that a distance between the two bars is shorter than a greatest surface length of the semiconductor substrate.

In yet still another embodiment of the present invention, the providing step further comprises providing the bottom cassette having a tapered end such that the semiconductor substrate is stopped from exiting the bottom cassette through the tapered end.

In another embodiment of the present invention, the providing step further comprises providing the support substrate that is optically transparent.

In still embodiment of the present invention, the providing step further comprises providing the support substrate having one or more via holes.

In another embodiment of the present invention, the inserting step further comprises preventing the small bars from contacting the semiconductor substrate.

In yet another embodiment of the present invention, the moving step further comprises moving the semiconductor substrate towards the bottom cassette without removing the semiconductor substrate from the apparatus.

In yet still another embodiment of the present invention, the introducing step further comprises exposing the semiconductor substrate to a chemical to release the semiconductor substrate from the support substrate.

In still another embodiment of the present invention, the introducing step further comprises heating the semiconductor substrate to release the semiconductor substrate from the support substrate.

In another embodiment of the present invention, the introducing step further comprises subjecting the apparatus to an ultrasonic treatment to release the semiconductor substrate from the support substrate.

A preferred version of the apparatus of separating one or more semiconductor substrates from one or more support substrates having features of the present invention comprises a top cassette having one or more small bars for stopping the support substrate inside the top cassette, and a bottom cassette for receiving the semiconductor substrate.

In another embodiment of the present invention, the bottom cassette has one or more large bars such that the semiconductor substrate remains inside the bottom cassette after being received.

In yet another embodiment of the present invention, the bottom cassette has one or more tapered ends such that the semiconductor substrate remains inside the bottom cassette after being received.

In yet still another embodiment of the present invention, the apparatus further comprises a basket in which the bottom cassette and the top cassette are placed.

In still another embodiment of the present invention, the apparatus further comprises the top cassette and the bottom cassette having a first wall, a second wall being substantially parallel to the first wall and coupled to the first wall, a plurality of tabs extending from each wall towards the other wall, wherein the plurality of tabs have approximately equal lengths and are substantially coplanar with each other.

In another embodiment of the present invention, the apparatus further comprises: (a) the top cassette having one or more top pins extending from a bottom surface of the first wall, and one or more top pin apertures on a bottom surface of the second wall; (b) the bottom cassette having one or more bottom pins extending from a top surface of the second wall, and one or more bottom pin apertures on a top surface of the first wall. The top pin on the top cassette is inserted into the bottom pin aperture on the bottom cassette. The bottom pin on the bottom cassette is inserted into the top pin aperture on the top cassette. The plurality of tabs on the top cassette is substantially aligned with the plurality of tabs on the bottom cassette. The top cassette and the bottom cassette are attached in vertical alignment.

In yet another embodiment of the present invention, the apparatus further comprises the bottom cassette having the first wall and the second wall made of metal coated with tetrafluoroethylene polymer fiber.

In yet still another embodiment of the present invention, the small bar is made of a material containing tetrafluoroethylene polymer fiber.

In still another embodiment of the present invention, a first small bar is embedded within an aperture on the first wall and a second small bar is embedded within an aperture on the second wall, such that a distance between the two small bars is shorter than a greatest surface length of the supporting substrate but longer than a greatest surface length of the semiconductor substrate.

Another preferred version of the apparatus of separating one or more semiconductor substrates from one or more support substrates having features of the present invention comprises a top cassette and a bottom cassette. Each cassette has a first wall, a second wall being substantially parallel to the first wall and coupled to the first wall, a first interior surface on the first wall facing towards the second wall, a second interior surface on the second wall facing towards the first wall. Each cassette also has a plurality of tabs extending from the first interior surface towards the second interior surface, where the tabs have approximately equal lengths and are substantially coplanar with each other. It also has a plurality of tabs extending from the second interior surface towards the first interior surface, where the tabs have approximately equal lengths and are substantially coplanar with each other. The top cassette has one or more small bars made of a material containing tetrafluoroethylene polymer fiber along the interior surface of at least one wall for stopping the support substrate inside the top cassette from dropping into the bottom cassette. The bottom cassette for receiving the semiconductor substrate has a stopping means to hold the semiconductor substrate within said bottom cassette after being received. The top cassette is capable of receiving the semiconductor substrate, and the support substrate is coupled to the semiconductor substrate in a manner whereby a first surface of the semiconductor substrate is positioned substantially parallel to a force of gravity. The top cassette is attached to the bottom cassette, such that the plurality of tabs on the top cassette is substantially aligned with the plurality of tabs on the bottom cassette, such that the top cassette and the bottom cassette are attached in vertical alignment.

In another embodiment of the present invention, the apparatus further comprises the top cassette further comprising one or more top pins extending from a bottom surface of the first wall, and one or more top pin apertures on a bottom surface of the second wall. The apparatus also has the bottom cassette further comprising one or more bottom pins extending from a top surface of the second wall, and one or more bottom pin apertures on a top surface of the first wall. The top pin on the top cassette is inserted into the bottom pin aperture on the bottom cassette and the bottom pin on the bottom cassette is inserted into the top pin aperture on the top cassette, such that the top cassette and the bottom cassette are attached in vertical alignment.

DRAWINGS

For simplicity and clarity of illustration, the drawings are not necessarily drawn to scale. Furthermore, the same reference numbers in different figures denote the same elements.

DETAILED DESCRIPTION OF THE DRAWINGS

The following describes in detail one embodiment of the invention and several variations of that embodiment. This discussion should not be construed, however, as limiting the invention to those particular embodiments. Practitioners skilled in the art will recognize numerous other possible embodiments as well as the ones specifically described. For a definition of the complete scope of the invention, the reader is directed to the appended claims.

This invention allows a highly efficient, high capacity batch demounting process for separating thinned semiconductor substrates from support substrates in contrast to the existing single semiconductor substrate separation process. This invention involves vertically aligning a standard Teflon™ (a trade name for Du Pont's polytetrafluoroethylene fiber) cassette on the bottom (bottom cassette) with a modified metal cassette (top cassette) on the top. The purpose of the top cassette is to allow only the thinned semiconductor substrates to slide down and to block the support substrates from passing through to the bottom cassette. The semiconductor substrates and the coupled support substrates that are coupled by an adhesive are loaded into a row of slots in the top cassette. The two cassettes can be placed in a basket made of a metal frame and net sidewalls. The two cassettes and the substrates, which may optionally be contained in the basket, are introduced to a dissolving agent such as a hot chemical (gas, vapor, or liquid) or heat alone to dissolve or melt the adhesive and thus to weaken the cohesive force between the semiconductor substrates and the support substrates. Then the semiconductor substrates will be gradually pulled down from the support substrates by gravitational force and will vertically slide down into the bottom cassette. When a liquid chemical solvent is used as a dissolving agent, the liquid chemical solvent works as a buffer to allow the semiconductor substrates to gently drop into the bottom cassette and thus to avoid the semiconductor substrate from fracturing by reducing their rate of descent.

The bottom cassette can be made of a material containing Teflon™ if the solvent temperature is lower than about 150° C. Otherwise, if the solvent temperature is higher than 150° C., it can be a standard metal cassette with Teflon™ coating on the inside to prevent the semiconductor substrates from being scratched or otherwise damaged by the metal and to withstand high temperature.

The top cassette can be a conventional metal cassette, or a quartz cassette in some cases. If using a metal cassette, the simple way to prepare it is to modify a conventional metal cassette by removing the original Teflon™ bars on both walls, which were used to block and hold the semiconductor substrates, and machine additional indentations into the walls to insert two smaller Teflon™ bars to block the support substrates from sliding down into the bottom cassette upon demounting. The two small Teflon™ bars are designed to block the support substrates while letting the semiconductor substrates pass through.

For round-shaped semiconductor substrates with a major flat edge, the support substrates can be of the same size as the semiconductor substrate or bigger than the semiconductor substrate. When this type of semiconductor substrate is loaded into the top cassette, the major flat edge should face either of the cassette walls.

For semiconductor substrates with other shapes, such as round-shaped semiconductor substrates without a major flat edge or rectangular-shaped semiconductor substrates, the support substrates should be bigger in size than the semiconductor substrates. The purpose of this size selection is to force the support substrates to remain in the top cassette while letting the semiconductor substrates pass through the two Teflon™ bars to the bottom cassette.

For support substrates with thicknesses of less than fifty mils or for combined thicknesses of semiconductor substrate and the support substrate less than 60 mils, the number of loaded semiconductor substrates per single top cassette can be up to twenty-five. For support substrates with thickness of more than eighty mils or for combined semiconductor substrates and support substrates with thicknesses of more than ninety mils, the top cassette needs to be modified to have twelve slots rather than the original twenty-five.

The thinned semiconductor substrates may be GaAs semiconductor substrates, Si semiconductor substrates, or ceramic substrates for RF and microwave. They may be physically thinned by a grinder, a lapper machine, or a polisher machine, and may as well be chemically thinned by an acid.

The semiconductor substrate size can range from one inch to sixteen inches in diameter, and they can be of various shapes, including, but not limited to, circles and rectangles.

The support substrates can be made of any material that is chemically resistant. Examples include semiconductor substrates, ceramic substrates, sapphire, and glass or quartz substrates.

The support substrate size can also range from one inch to sixteen inches in diameter, and they can also be physically thinned by a grinder, lapper machine, polisher machine, or they can be thinned by dissolving chemicals.

If there is backside alignment through the use of infrared light wave, the support substrates should be optically transparent to allow the infrared light wave to penetrate them. Sapphire substrates are commonly used as support substrates because they are chemically resistant and optically transparent.

The semiconductor substrates are mounted on the support substrates using an adhesive material such as a wax, a wax mixed with photoresistor, or a semiconductor substrate grip material. The adhesive for mounting the semiconductor substrates onto the support substrates can be of any material that can (1) withstand the process condition, and (2) be melted by heat or dissolving agent.

To dissolve the adhesive in order to separate the semiconductor substrates from the support substrates, any suitable gas, vapor, or liquid chemical can be used as a dissolving agent. If metal cassettes are used in the present invention for the top and bottom cassettes, a viable alternative is to simply heat the two cassettes to melt the adhesive without using any gas, vapor or liquid. However, the use of a liquid solvent is preferred because it will reduce the velocity at which the semiconductor substrates slide down toward the bottom of the bottom cassette. By reducing the velocity of their descent, the semiconductor substrates are less likely to break. Additionally, using a liquid solvent is desirable because the semiconductor substrates will also be cleaned of debris and adhesive material during the separation process.

Figure 1:
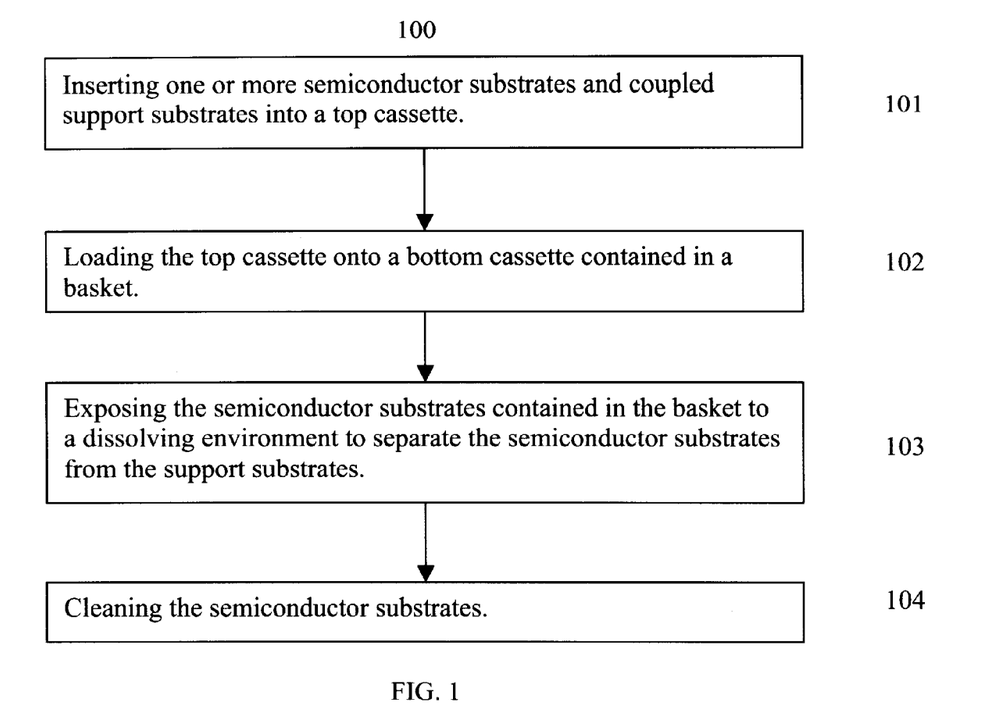
FIG. 1 outlines a method of demounting one or more semiconductor substrates from one or more support substrates according to the present invention.

FIG. 1 outlines the method 100 for batch semiconductor substrate demounting process. Method 100 includes a step 101 for inserting one or more semiconductor substrates that are coupled to one or more support substrates into the slots inside the top cassette. The semiconductor substrates can be made of any material, such as silicon, ceramic, glass, or quartz. Therefore, hereinafter it is understood that the term semiconductor substrate can include non-semiconductor substrates. The semiconductor substrates are coupled to the support substrates by an adhesive such as a wax, a wax mixed with photoresistor, or a semiconductor substrate grip material.

Method 100 continues with a step 102 for loading the top cassette onto a bottom cassette contained in a basket. Step 102 includes securing the top cassette and the bottom cassette in vertical alignment by inserting one or more pins that extend from the top cassette into the corresponding pin holes on the top surface of the bottom cassette, while inserting one or more pins that extend from the bottom cassette into the corresponding pin holes on the bottom surface of the top cassette.

After completing step 102, method 100 proceeds with a step 103 for exposing one or more semiconductor substrates and one or more support substrates contained in the basket to a dissolving agent for separating the semiconductor substrates from the support substrates. Step 103 can be performed by submerging the basket containing the semiconductor substrates and the support substrates into a dissolving agent to dissolve, melt, soften, or at least weaken the adhesive and to separate or release the semiconductor substrates from the support substrates. This is the first of a two-stage exposure of the substrates to dissolving agents in the demounting process. In the first stage, the substrates and the basket containing the cassettes can be placed into a tank already filled with the dissolving agent, or the substrates in the cassettes can be placed into an empty tank which is later filled with the dissolving agent.

The first dissolving agent can be a solvent or any other chemical that dissolves, melts, softens, or at least weakens the adhesive. It can also be heat alone. In a preferred embodiment, the first dissolving agent does not substantially damage the semiconductor substrates, the support substrates, or the cassettes. The first dissolving agent can be heated to a temperature of up to about four-hundred degrees Celsius to reduce the time required to remove the semiconductor substrates from the support substrates.

The second stage in step 103 can also include subsequently submerging the basket containing the semiconductor substrates into a second dissolving agent after the first submerging stage. Preferably, the second submerging stage occurs after the semiconductor substrates are already separated from the support substrates during the first submerging stage. The top cassette can then be removed from the basket, leaving only the bottom cassette and the semiconductor substrates inside the basket. Furthermore, the first and second solutions preferably consist essentially of the same or similar, chemical or chemicals. The second submerging stage is used to ensure that the adhesive is completely removed from the semiconductor substrates. The second dissolving agent can also be heated. In an embodiment where a photoresistor is used as the adhesive, the second solution is preferably heated to a lower temperature than the first solution.

Method 100 continues with a step 104 for cleaning the semiconductor substrates. Step 104 can include, among other steps, rinsing the semiconductor substrates with deionized water or alcohol to remove the first and second solutions from the semiconductor substrates. If the deionized water is not heated to a similar temperature as the first solution or second solution, the semiconductor substrates should be allowed to cool for several seconds prior to being cleaned in step 104. This short waiting period of approximately five to thirty-five seconds reduces the possibility of fracturing the semiconductor substrates due to thermal shock.

Figure 2:
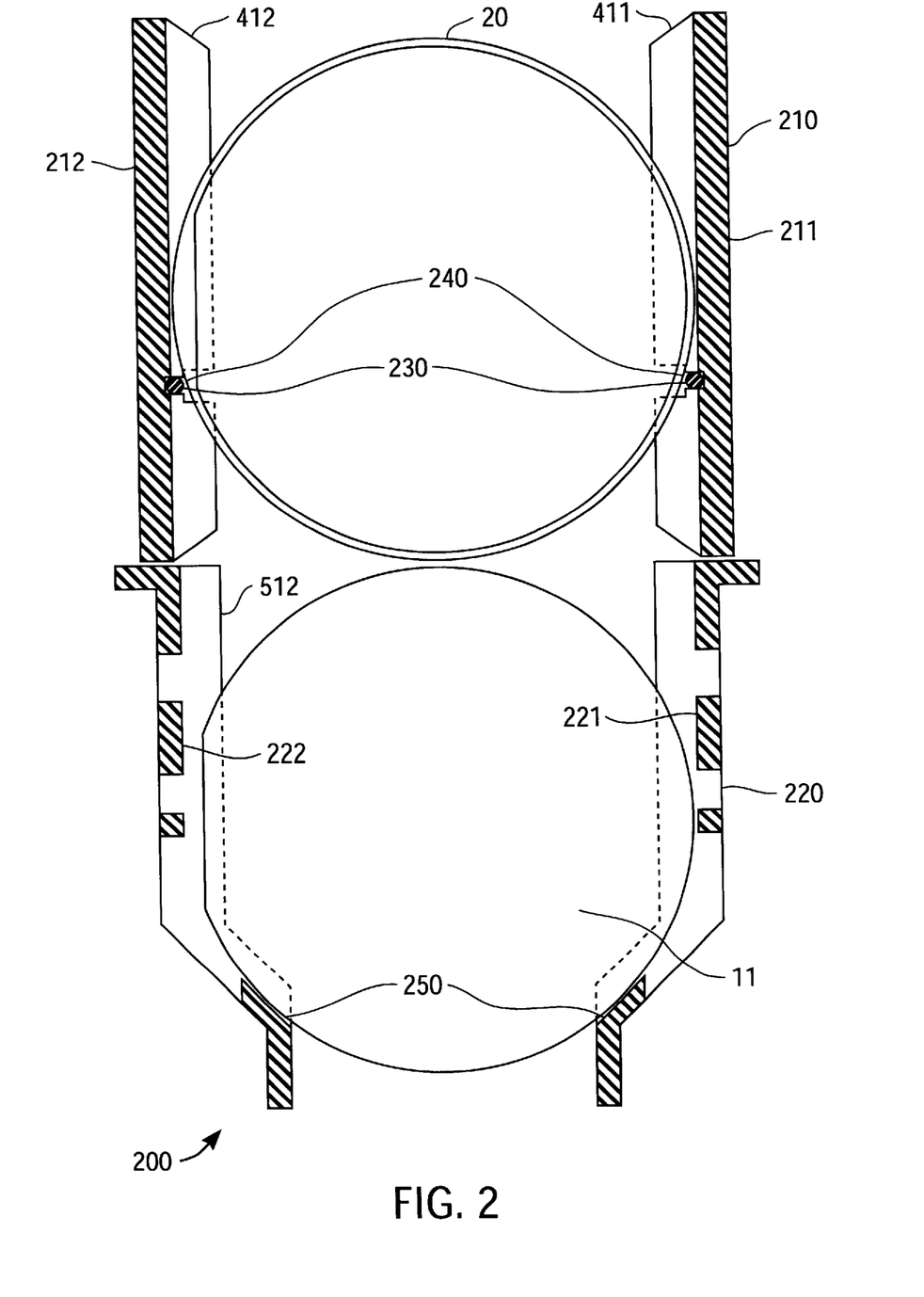
FIG. 2 illustrates a side view of an apparatus used in the present invention.

FIG. 2 illustrates a side view of an apparatus 200 used to demount one or more semiconductor substrates from one or more support substrates, comprising a top cassette 210 and a bottom cassette 220. Top cassette 210 is a cassette capable of holding several semiconductor substrates coupled to an equal number of support substrates. The substrates can range from one inch to sixteen inches in diameter, and the shape can be of various types, including, but not limited to, circles and rectangles. The support substrates can be made from any material that is chemically resistant. If backside alignment is involved, the support substrate should be optically transparent. Support substrates made from sapphire are commonly used because they are both chemically resistant and optically transparent.

In a preferred embodiment, the top cassette 210 holds several semiconductor substrates with major flat edge 11 and coupled support substrates 20. Top cassette 210 includes a top first wall 211 and a top second wall 212 that are substantially parallel to each other. A set of tabs 411 extend from first wall 211 towards a set of tabs 412 that extend from second wall 212, wherein the two set of tabs 411 and 412 are parallel to each other. In a preferred embodiment, top cassette 210 is identical to a conventional semiconductor substrate cassette, except that tabs 411 and 412 both have an indentation 240 where a small Teflon™ bar 230 is inserted. The distance between small Teflon™ bar 230 within tabs 411 and that within tabs 412 is shorter than the diameter of support substrates 20 but is greater than the shortest distance between the edges of semiconductor substrates 11. Bottom cassette 220 is a cassette for receiving a plurality of semiconductor substrates 11 as they move down towards the bottom of apparatus 200 due to gravitational force. Bottom cassette 220 includes a bottom first wall 221 and a bottom second wall 222 that are substantially parallel to each other. A set of tabs 511 extends from first wall 221 towards a set of tabs 512 that extends from second wall 222. In a preferred embodiment, bottom cassette 220 is made substantially or entirely from Teflon™ when the temperature of the dissolving chemical in step 103 is lower than about 130° C. If a conventional metal cassette is used, bottom cassette 220 should be coated with Teflon™ on its inner surface to prevent the scratching of or otherwise damaging the semiconductor substrates. The bottom cassette also has a tapered end 250 on bottom first wall 221 and bottom second wall 222, and the shortest distance between the two tapered ends 250 is shorter than the shortest distance between the edges of semiconductor substrates 11.

Figure 3:
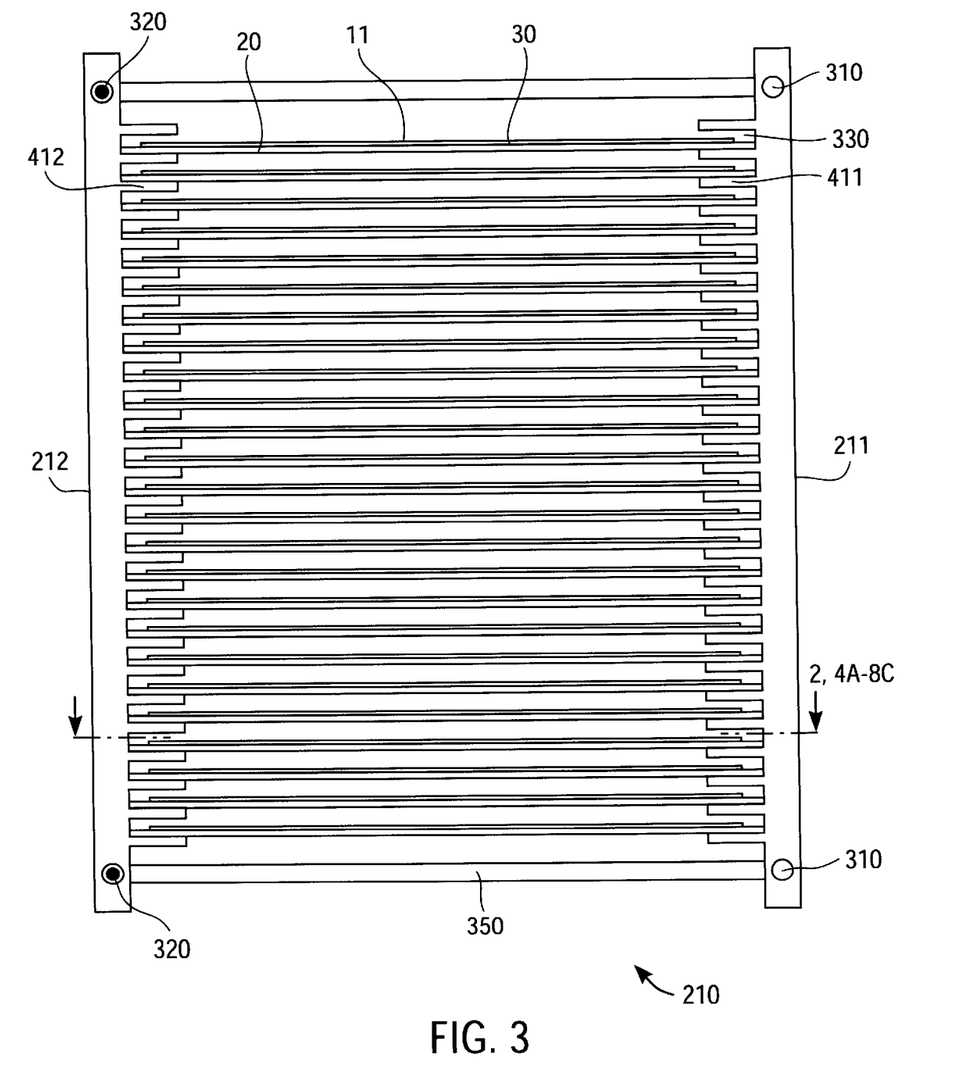
FIG. 3 illustrates a top view of an apparatus used in the present invention, showing a series of slots and the inserted semiconductor substrates with coupled support substrates.

FIG. 3 illustrates a bottom view of apparatus 200 as in FIG. 2. Top first wall 211 and top second wall 212 are connected by a number of connecting rods 350. Top first wall 211 includes a set of tabs 411 and top second wall 212 includes a set of tabs 412. Any two of neighboring tabs 411 are parallel with each other, and any two of neighboring tabs 412 are parallel with each other. Further each pair of tabs 411 and opposing pair of tabs 412 is parallel with each other and forms a slot 330. The width of slot 330 is greater than the thickness of semiconductor substrate 11 and support substrate 20 combined. Top first wall 211 includes at least one top pin hole 310 on its bottom surface. Top second wall 212 includes at least one top pin 320 extending from its bottom surface. Adhesives 30 are located between semiconductor substrates 11 and support substrates 20 to couple substrates 11 and 20 together. Adhesives 30 can be made of any material that can be melted by some chemical or heat. The chemical can be in the form of gas, vapor, or liquid. A wax, a wax mixed with photoresistor, and a semiconductor substrate grip material are commonly used as an adhesive. While it is possible to melt adhesives 30 simply by heat and without using any gas, vapor, or liquid chemical, the use of a liquid chemical reduces the velocity at which semiconductor substrates 11 descend toward bottom cassette 220. By reducing the velocity of their descent, semiconductor substrates 11 are less likely to break. Additionally, semiconductor substrates 11 will be simultaneously cleaned by the chemical during the descent.

Figure 4A:
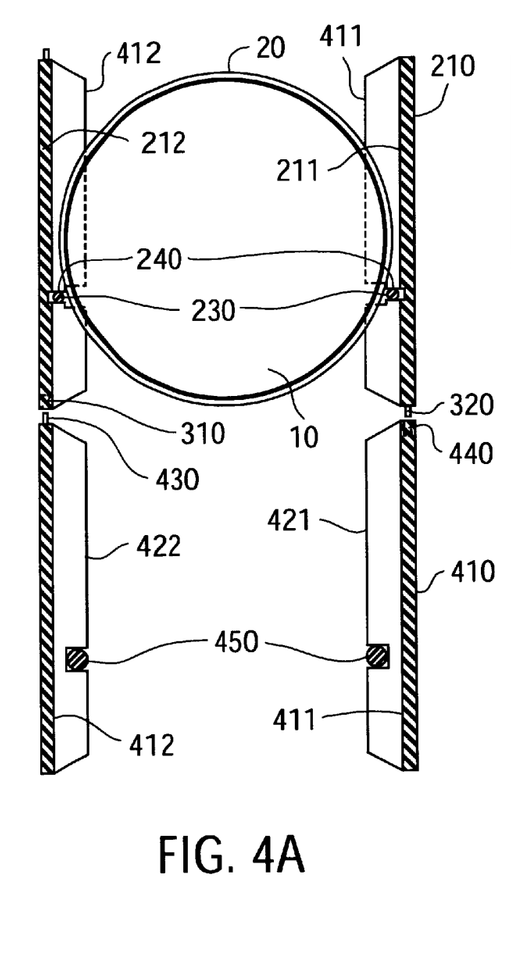
FIGS. 4A–C illustrate progressive side views of the apparatus showing the separation of a semiconductor substrate from its support substrate during the demounting process of the present invention.
Figure 4B:
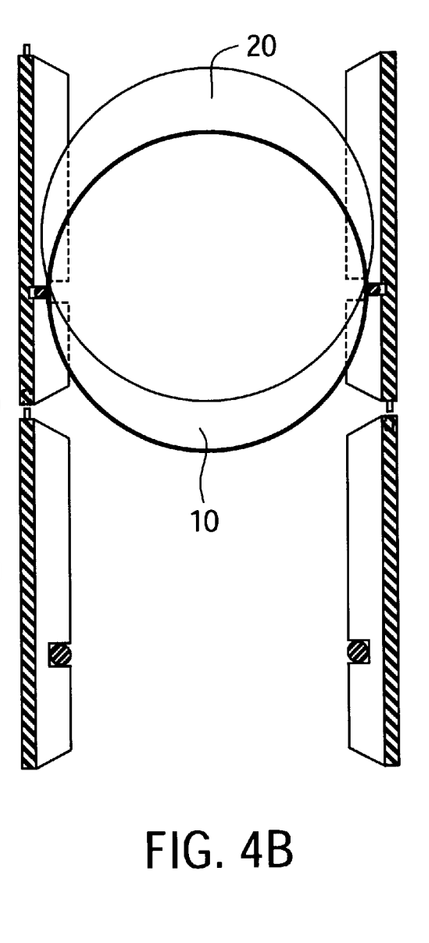
Figure 4C:
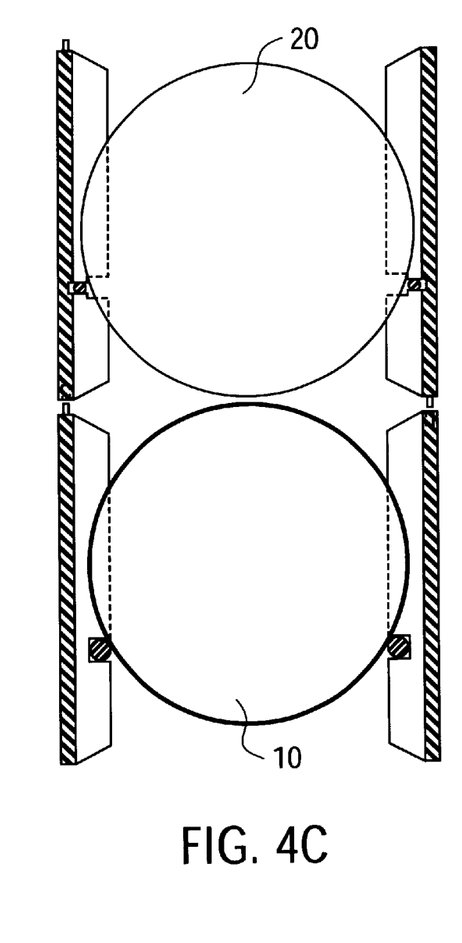

FIGS. 4A–C illustrate progressive side views of apparatus 200 showing a separation of semiconductor substrate without major flat edge 10 from its coupled support substrate 20 during the manufacturing process of the present invention. The support substrate 20 can be round in shape but with larger diameter. In a preferred embodiment as shown, the difference between the diameters of semiconductor substrate 10 and support substrate 20 is about 0.12 inch or 3 mm.

FIG. 4A illustrates semiconductor substrate 10 and the coupled support substrate 20 resting within top cassette 210 on a pair of small Teflon™ bars 230 embedded within indentations 240 on tabs 411 and 412. Top cassette 210 includes at least one top pin 320 that extends from the bottom of top first wall 211, which is inserted into a bottom pin hole 440 on bottom first wall 411. Bottom cassette 410 includes at least one bottom pin 430 that extends from the top of bottom second wall 412, which is inserted into a top pin hole 310 on top second wall 212. Tabs 411 and 412 in top cassette 210, and tabs 421 and 422 in bottom cassette 410, are thereby aligned with each other, respectively.

FIG. 4B illustrates semiconductor substrate 10 separating from support substrate 20 during the demounting process of the present invention, descending towards bottom cassette 410.

FIG. 4C illustrates semiconductor substrate 10 completely separated from support substrate 20 and resting within bottom cassette 410. Bottom cassette 410 includes a large Teflon™ bar 450 embedded within tabs 421 and tabs 422. The distance between the two large Teflon™ bars 450 is shorter than the diameter of semiconductor substrate 10. Semiconductor substrate 10 rests on the two large Teflon™ bars 450 after separating from support substrate 20.

Figure 5A:
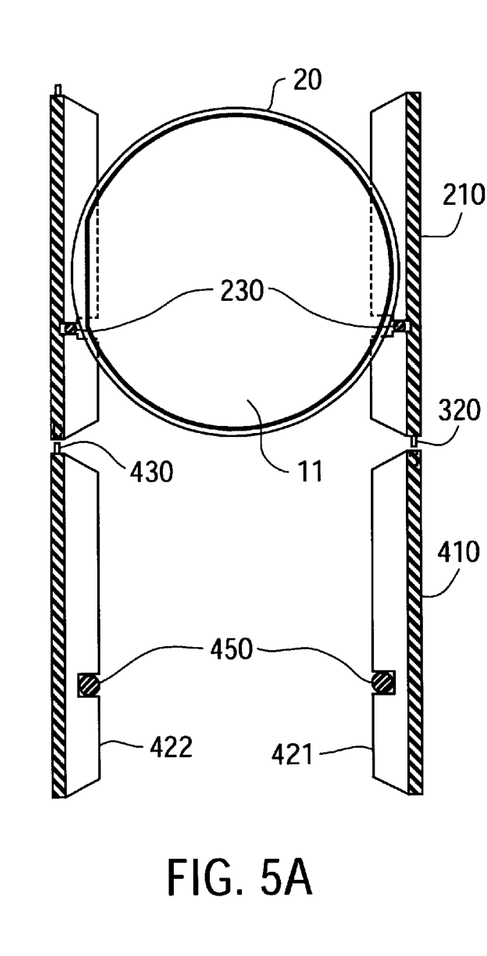
FIGS. 5A–C illustrate progressive side views of another embodiment of the apparatus of FIGS. 4A–C.
Figure 5B:
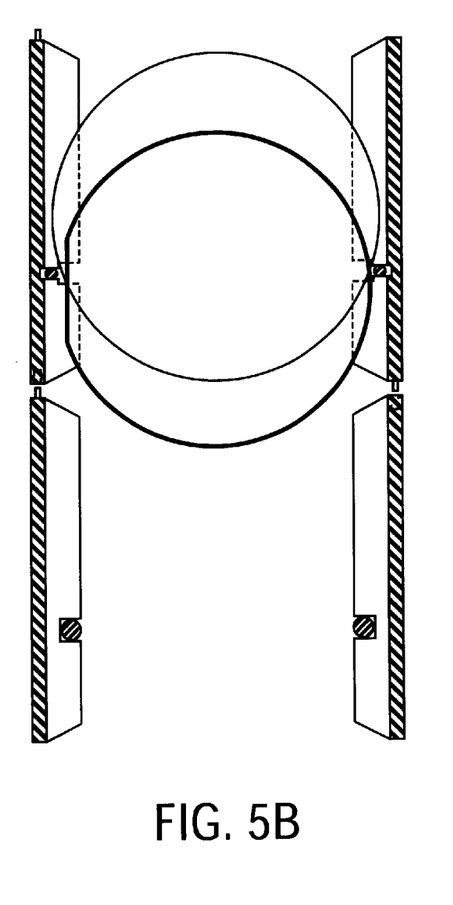
Figure 5C:
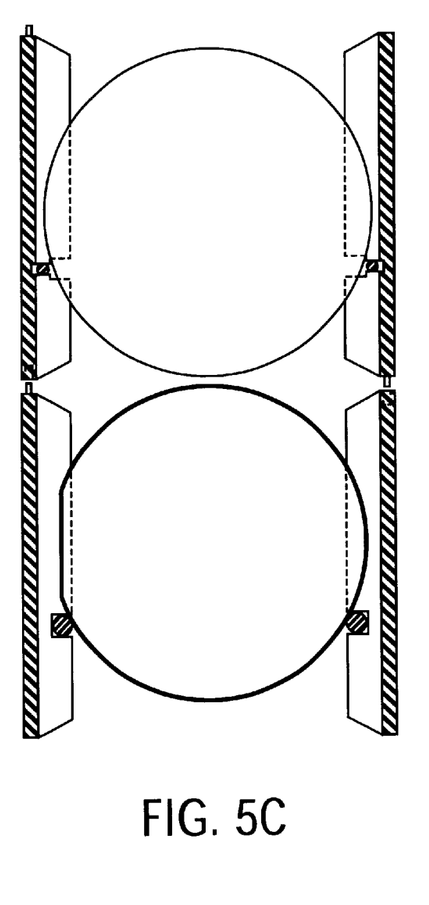

FIGS. 5A–C illustrate an alternative embodiment of the present invention as shown in FIGS. 4A–C.

FIG. 5A illustrates semiconductor substrate with major flat edge 11 and the coupled support substrate 20 that are inserted in the top cassette and supported by two small Teflon™ bars 230. The distance between the two small Teflon™ bars 230 is shorter than the diameter of support substrate 20 but longer than the distance between the major flat edge and the opposite round edge of semiconductor substrate 11.

FIG. 5B illustrates semiconductor substrate 11 separating from support substrate 20 during the demounting process of the present invention, and descending towards bottom cassette 410.

FIG. 5C illustrates semiconductor substrate 11 completely separated from support substrate 20 and resting within bottom cassette 410. Bottom cassette 410 includes a large Teflon™ bar 450 embedded within tabs 421 and tabs 422. The distance between the two large Teflon™ bars 450 is shorter than the distance between the major flat edge and the opposite round edge of semiconductor substrate 11. Semiconductor substrate 11 rests on the two large Teflon™ bars 450 after separating from support substrate 20.

Figure 6A:
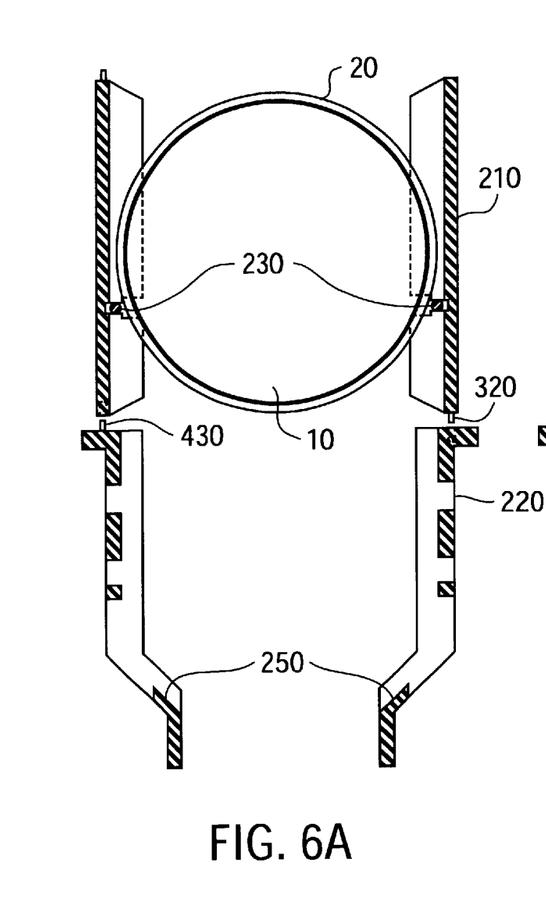
FIGS. 6A–C illustrate progressive side views of another embodiment of the apparatus of FIGS. 4A–C.
Figure 6B:
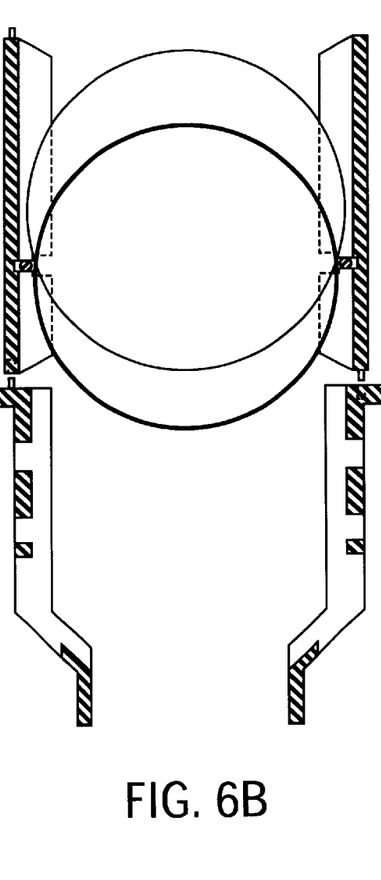
Figure 6C:
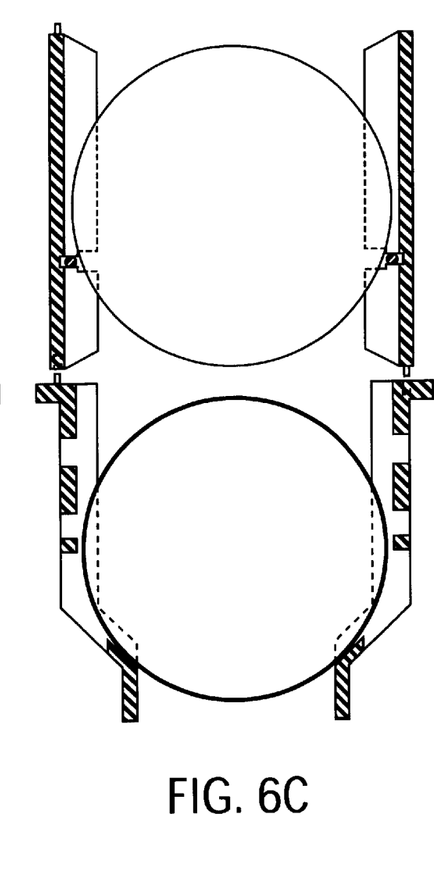

FIGS. 6A–C illustrate an alternative embodiment of the present invention as shown in FIGS. 4A–C.

FIG. 6A illustrates semiconductor substrate without major flat edge 10 with coupled support substrate 20 that are inserted in top cassette and supported by two small Teflon™ bars 230. The distance between the two small Teflon™ bars 230 is shorter than the diameter of support substrate 20 but longer than the diameter of semiconductor substrate 10.

FIG. 6B illustrates semiconductor substrate 10 separating from support substrate 20 during the demounting process of the present invention, descending towards bottom cassette 220.

FIG. 6C illustrates semiconductor substrate 10 completely separated from support substrate 20 and resting within bottom cassette 220. Bottom cassette 220 includes a set of tapered ends 250 that are coated with Teflon™ to prevent scratching of the semiconductor substrate 10. The shortest distance between the two tapered ends 250 is shorter than the diameter of semiconductor substrate 10. Semiconductor substrate 10 rests on tapered ends 250 after separating from support substrate 20.

Figure 7A:
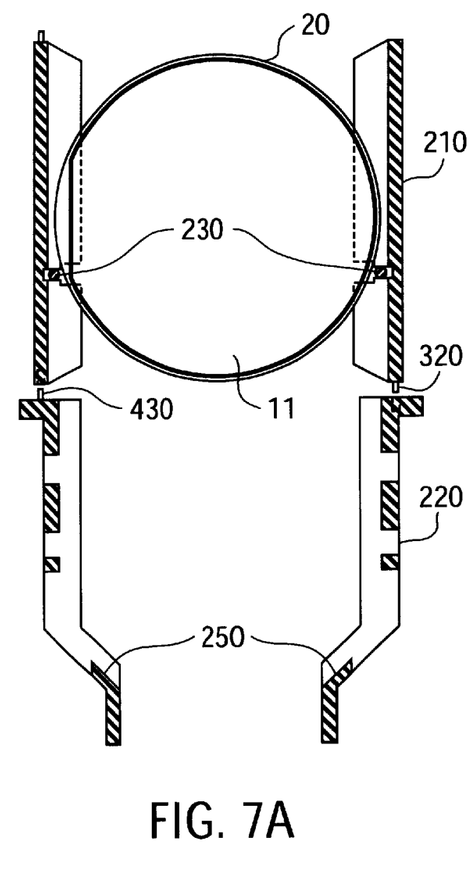
FIGS. 7A–C illustrate progressive side views of another embodiment of the apparatus of FIGS. 4A–C.
Figure 7B:
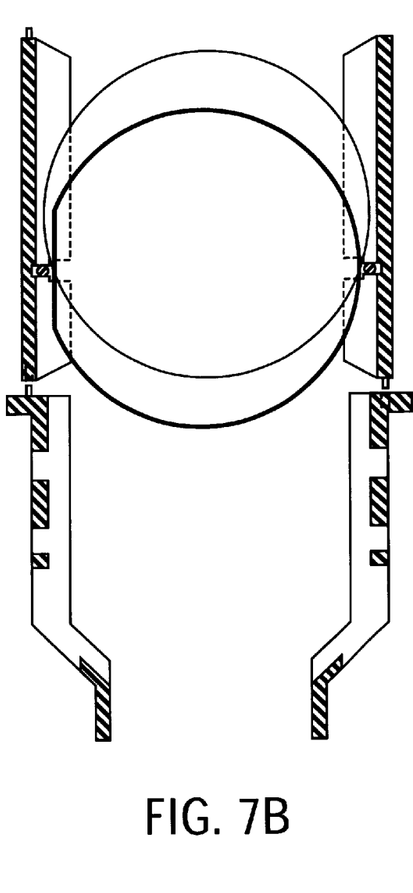
Figure 7C:
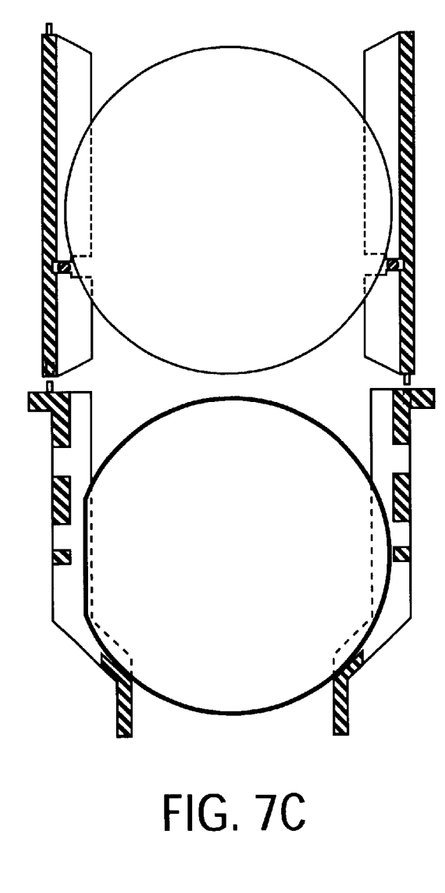

FIGS. 7A–C illustrate an alternative embodiment of the present invention as shown in FIGS. 4A–C.

FIG. 7A illustrates semiconductor substrate with major flat edge 11 and coupled support substrate 20 that are inserted in the top cassette and supported by two small Teflon™ bars 230. The distance between the two small Teflon™ bars 230 is shorter than the diameter of support substrate 20 but longer than the distance between the major flat edge and the opposite round edge of semiconductor substrate 11.

FIG. 7B illustrates semiconductor substrate 11 separating from support substrate 20 during the demounting process of the present invention, descending towards bottom cassette 220.

FIG. 7C illustrates semiconductor substrate 11 completely separated from support substrate 20 and resting within bottom cassette 220. Bottom cassette 220 includes a set of tapered ends 250 that are coated with Teflon™ to prevent scratching of the semiconductor substrate 11. The shortest distance between the two tapered ends 250 is shorter than the distance between the major flat edge and the opposite round edge of semiconductor substrate 11. Semiconductor substrate 11 rests on tapered ends 250 after separating from support substrate 20.

Figure 8A:
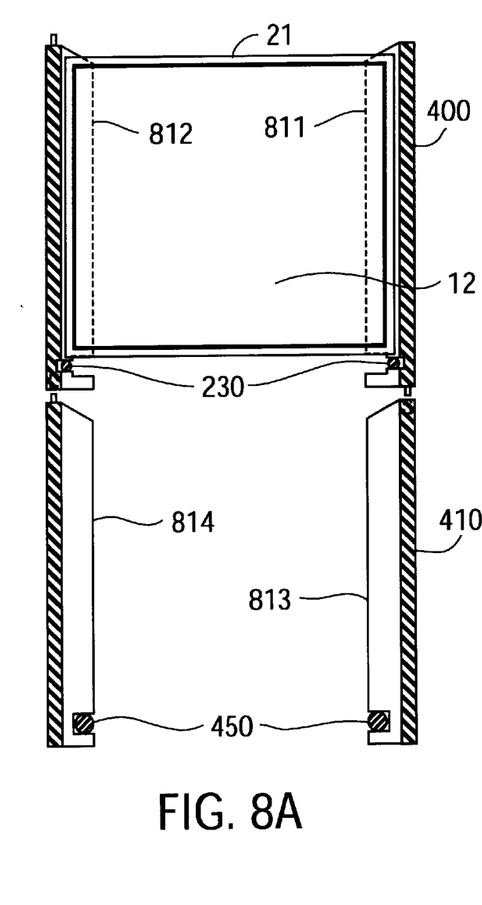
FIGS. 8A–C illustrate progressive side views of another embodiment of the apparatus of FIGS. 4A–C.
Figure 8B:
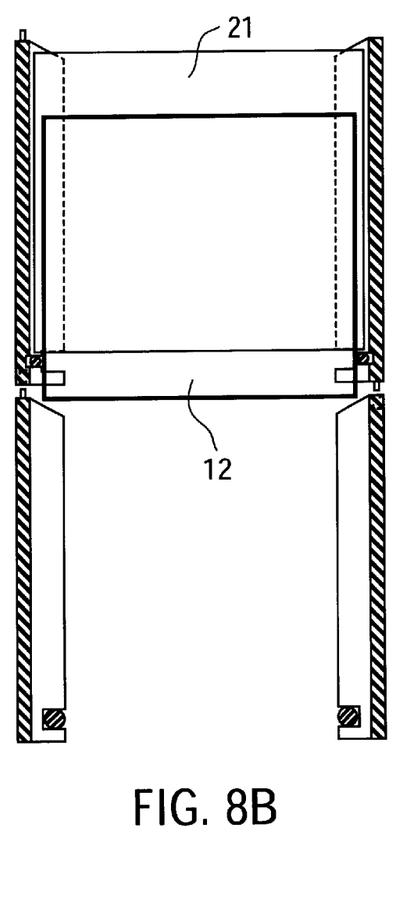
Figure 8C:
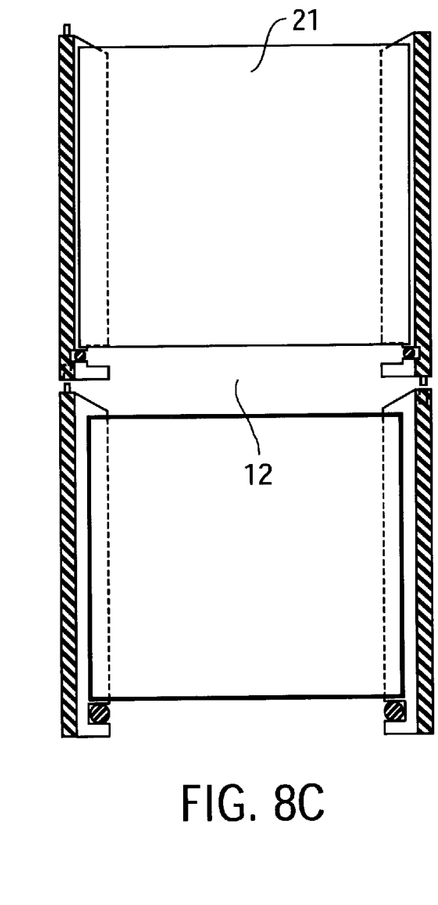

FIGS. 8A–C illustrate an alternative embodiment of the present invention as shown in FIGS. 4A–C.

FIG. 8A illustrates a rectangular semiconductor substrate 12 with coupled support substrate 21 that are inserted in rectangular top cassette 400 and supported by two small Teflon™ bars 230 that are embedded within tabs 811 and tabs 812. The distance between the two small Teflon™ bars 230 is shorter than a length of support substrate 21 but longer than the length of semiconductor substrate 12.

FIG. 8B illustrates semiconductor substrate 12 separating from support substrate 21 during the demounting process of the present invention, descending towards bottom cassette 410.

FIG. 8C illustrates semiconductor substrate 12 completely separated from support substrate 21 and resting within rectangular bottom cassette 410. Bottom cassette 410 includes a large Teflon™ bar 450 embedded within tabs 813 and tabs 814. The distance between the two large Teflon™ bars 450 is shorter than the length of semiconductor substrate 12. Semiconductor substrate 12 rests on the two large Teflon™ bars 450 after separating from support substrate 21.

I claim:

1. A method of separating one or more semiconductor substrates from one or more support substrates, the method comprising the steps of:
    a) providing an apparatus having:
        i) a top cassette having:
            1) a plurality of vertical slots, and
            2) one or more small bars for stopping the support substrate inside the top cassette; and
        ii) a bottom cassette having a plurality of vertical slots;
    b) vertically inserting the semiconductor substrate into said slot of the top cassette while the semiconductor substrate is coupled to the support substrate,
        wherein a first surface of each semiconductor substrate is positioned substantially parallel to a force of gravity during the inserting step;

c) supporting the support substrate above the small bars in the top cassette;

d) introducing the apparatus to a dissolving agent to separate the semiconductor substrate from the support substrate, wherein the first surface of each semiconductor substrate is positioned substantially parallel to the force of gravity during the introducing step, and wherein the force of gravity moves the semiconductor substrate from the top cassette towards the bottom cassette.

2. The method of claim 1 wherein the providing step further comprises a basket in which the bottom cassette and the top cassette are placed.

3. The method of claim 1 wherein the providing step further comprises:

a) providing the bottom cassette having:
  i) a first wall;
  ii) a second wall substantially parallel to the first wall and coupled to the first wall;
  iii) a large bar embedded inside the first wall; and
  iv) a large bar embedded inside the second wall; such that a distance between the two bars is shorter than a greatest surface length of the semiconductor substrate.

4. The method of claim 1 wherein the providing step further comprises providing the bottom cassette having a tapered end such that the semiconductor substrate is stopped from exiting the bottom cassette through the tapered end.

5. The method of claim 1 wherein the providing step further comprises providing the support substrate that is optically transparent.

6. The method of claim 1 wherein the providing step further comprises providing the support substrate having one or more via holes.

7. The method of claim 1 wherein the inserting step further comprises preventing the small bars from contacting the semiconductor substrate.

8. The method of claim 1 wherein the introducing step further comprises moving the semiconductor substrate towards the bottom cassette without removing the semiconductor substrate from the apparatus.

9. The method of claim 1 wherein the introducing step further comprises exposing the semiconductor substrate to a chemical to release the semiconductor substrate from the support substrate.

10. The method of claim 1 wherein the introducing step further comprises heating the semiconductor substrate to release the semiconductor substrate from the support substrate.

11. The method of claim 1 wherein the introducing step further comprises subjecting the apparatus to an ultrasonic treatment to release the semiconductor substrate from the support substrate.

12. The method of claim 1 further comprising the steps of:

a) removing the top cassette from the apparatus;

b) exposing the apparatus to a cleaning agent to clean the semiconductor substrate; and c) drying the semiconductor substrate after the exposing step.

* * * * *